United States Patent
Imada et al.

(10) Patent No.: US 9,647,527 B2
(45) Date of Patent: May 9, 2017

(54) POWER SUPPLY CIRCUIT AND POWER FACTOR CORRECTION CIRCUIT

(71) Applicant: FUJITSU LIMITED, Kawasaki-shi, Kanagawa (JP)

(72) Inventors: Tadahiro Imada, Kawasaki (JP); Tatsuya Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 53 days.

(21) Appl. No.: 14/723,849

(22) Filed: May 28, 2015

(65) Prior Publication Data
US 2015/0372587 A1    Dec. 24, 2015

(30) Foreign Application Priority Data

Jun. 18, 2014  (JP) .................................. 2014-124922

(51) Int. Cl.
*H02M 3/156*    (2006.01)
*H02M 1/08*    (2006.01)
*H02M 1/34*    (2007.01)

(52) U.S. Cl.
CPC ............... *H02M 1/08* (2013.01); *H02M 1/34* (2013.01); *H02M 3/156* (2013.01); *H02M 2001/342* (2013.01); *H03K 2217/0036* (2013.01); *Y02B 70/1425* (2013.01); *Y02B 70/1491* (2013.01); *Y02P 80/112* (2015.11)

(58) Field of Classification Search
CPC .......... H02M 1/08; H02M 1/34; H02M 1/142; H02M 1/4208; H02M 1/44; H02M 3/156; H02M 2001/34; H02M 2001/342
See application file for complete search history.

(56) References Cited

U.S. PATENT DOCUMENTS

| 7,919,950 B2 * | 4/2011 | Uno ..................... H02M 1/4225 323/207 |
| 8,803,489 B2 * | 8/2014 | Li ....................... H02M 1/4216 323/207 |
| 2016/0190914 A1 * | 6/2016 | Kim ..................... H02M 1/4225 363/126 |

FOREIGN PATENT DOCUMENTS

| CN | 202652062 | 1/2013 |
| JP | 2002-353798 | 12/2002 |
| JP | 2006-80560 | 3/2006 |
| WO | 2011-067838 | 6/2011 |

OTHER PUBLICATIONS

TWOA—Taiwanese Office Action issued on Jul. 6, 2016 for corresponding Taiwan Application No. 104116671, with English translation.

* cited by examiner

Primary Examiner — Matthew Nguyen
(74) Attorney, Agent, or Firm — Fujitsu Patent Center

(57) ABSTRACT

A power supply circuit includes a switching element and a control section. The control section converts back electromotive force generated at the time of the operation of the switching element to optical energy and converts the optical energy to an electrical signal. Furthermore, the control section drives the switching element on the basis of the electrical signal obtained by converting the optical energy. Accordingly, unlike a case where surge energy is regenerated by resonance, there is no need to use a resonant element such as an inductor. As a result, circuit scale is reduced.

5 Claims, 10 Drawing Sheets

US 9,647,527 B2

POWER SUPPLY CIRCUIT AND POWER FACTOR CORRECTION CIRCUIT

CROSS-REFERENCE TO RELATED APPLICATION

This application is based upon and claims the benefit of priority of the prior Japanese Patent Application No. 2014-124922, filed on Jun. 18, 2014, the entire contents of which are incorporated herein by reference.

FIELD

The embodiments discussed herein are related to a power supply circuit and a power factor correction circuit.

BACKGROUND

In recent years the development of high electron mobility transistors (HEMTs) in which a gallium nitride (GaN) layer functions as an electron transit layer has advanced.

GaN has a band gap of about 3.4 eV which is wider than the bad gap (1.1 eV) of silicon (Si) or the band gap (1.4 eV) of gallium arsenide (GaAs). Accordingly, the breakdown voltage of GaN-based HEMTs (GaN-HEMTs) is higher than that of Si-based or GaAs-based devices and GaN-HEMTs are considered to be promising as high breakdown voltage power devices.

On the other hand, if a surge occurs, then a failure or the like may occur in a GaN-HEMI. Accordingly, a measure to effectively suppress a surge is required.

In the past a technique for suppressing surge voltage by exercising control so as to return to a power supply a charging electric charge in a snubber circuit connected to a switching element which performs high-frequency switching of an inverter apparatus was proposed. Furthermore, a technique for changing a drain-source state from a conducting state to a cutoff state by applying photoelectromotive force generated by a light receiving element to a transistor was proposed.

International Publication Pamphlet No. WO2011/067838
Japanese Laid-open Patent Publication No. 2002-353798

In the past a circuit in which an inductor and a capacitor are combined was used as an anti-surge measure. For example, the following technique is possible. A reactor (inductor) in a regeneration circuit corresponding to a switching element resonates with a snubber capacitor in a snubber circuit. As a result, a charging electric charge of the snubber capacitor is returned to a power supply to suppress surge voltage.

However, the size of an inductor is large among passive elements and its mounting area is also large. Accordingly, the scale of a circuit in which an inductor is used is large.

SUMMARY

According to an aspect, there is provided a power supply circuit including a switching element and a control section which converts back electromotive force generated at the time of operation of the switching element to optical energy and which drives the switching element on the basis of an electrical signal obtained by converting the optical energy.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
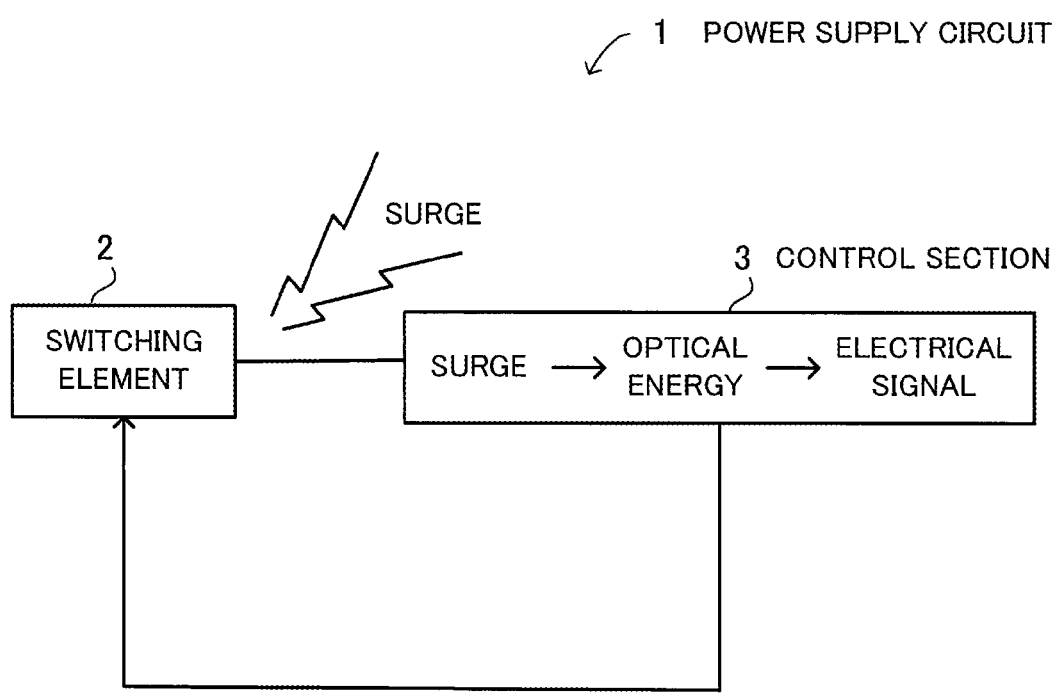
FIG. 1 illustrates an example of a power supply circuit according to a first embodiment.

Embodiments will now be described with reference to the accompanying drawings, wherein like reference numerals refer to like elements throughout.

(First Embodiment)

FIG. 1 illustrates an example of a power supply circuit according to a first embodiment.

A power supply circuit 1 includes a switching element 2 and a control section 3. The power supply circuit 1 regenerates back electromotive force generated at the time of the operation of the switching element 2 and uses it for driving the switching element 2. In the following description back electromotive force will be referred to as a surge. However, back electromotive force (which may be referred to as noise) may be smaller than a surge.

The switching element 2 is, for example, a field effect transistor (FET) and is turned on or off on the basis of a control signal.

The control section 3 converts a surge which occurs at the time of the operation of the switching element 2 to optical energy. Furthermore, the control section 3 converts the optical energy to an electrical signal and drives the switching element 2 on the basis of the electrical signal.

The power supply circuit 1 having the above structure converts a surge to optical energy and drives the switching element 2 on the basis of an electrical signal obtained by converting the optical energy. As a result, there is no need to use a resonant element, such as an inductor, as an anti-surge measure. Accordingly, circuit scale is reduced. In addition, a surge is converted to optical energy, so the surge is suppressed.

(Second Embodiment)

Figure 2:
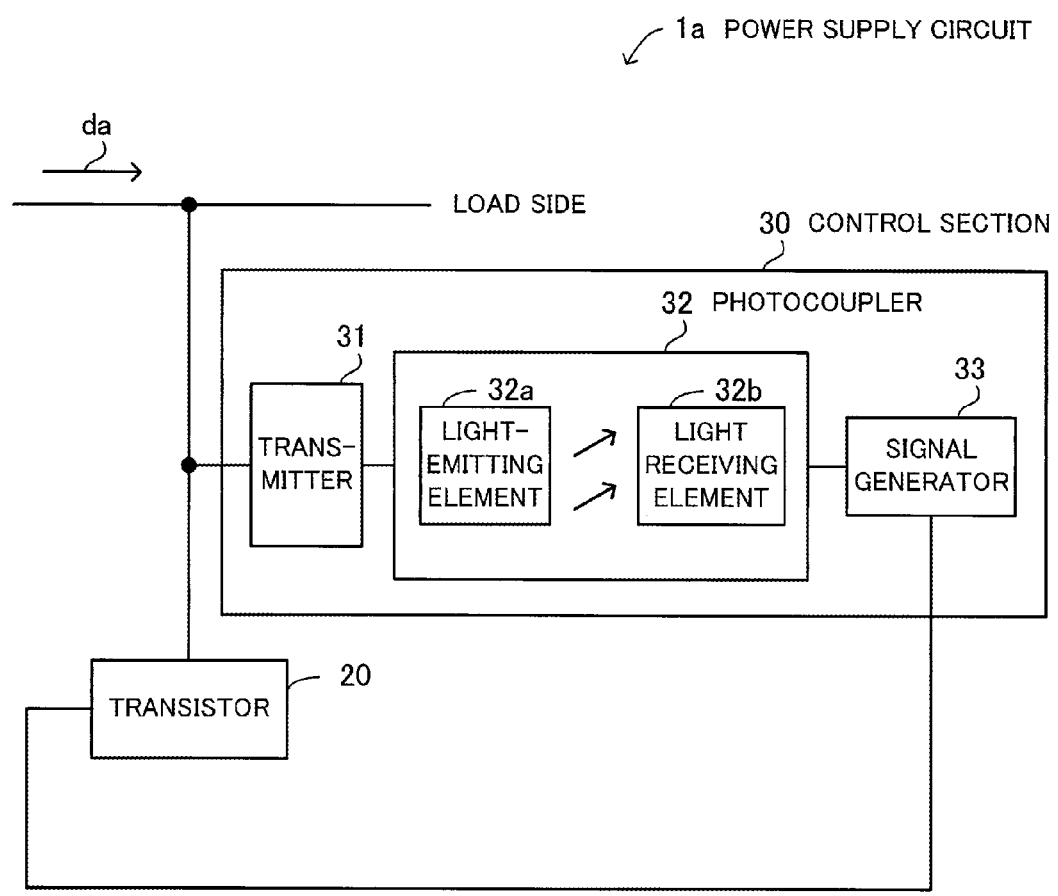
FIG. 2 illustrates an example of a power supply circuit according to a second embodiment.

FIG. 2 illustrates an example of a power supply circuit according to a second embodiment.

A power supply circuit 1a includes a transistor (field effect transistor) 20 and a control section 30. The control section 30 includes a transmitter 31, a photocoupler (converter) 32, and a signal generator 33. The transistor 20 corresponds to the switching element 2 illustrated in FIG. 1 and the control section 30 has the functions of the control section 3 illustrated in FIG. 1.

The transistor 20 performs switching to let or not to let a signal da flow to a load side. When the transistor 20 is off, the signal da flows to the load side. When the transistor 20 is on, the signal da flows to the transistor 20 side.

The transmitter 31 transmits to the photocoupler 32 a surge which instantaneously occurs beyond a steady state in the transistor 20. The photocoupler 32 includes a light-emitting element 32a and a light receiving element 32b. The light-emitting element 32a converts a surge which occurs during the driving of the transistor 20 to optical energy. The light receiving element 32b converts the optical energy to an electrical signal.

The signal generator 33 generates a gate signal to be supplied to a gate of the transistor 20 from the electrical signal outputted from the photocoupler 32. For example, when a surge occurs, the signal generator 33 generates as a gate signal a turn-off voltage signal by which the transistor 20 is turned off. Furthermore, the signal generator 33 generates at a determined switch-off timing a turn-off voltage signal by which the transistor 20 is turned off.

In addition, when surge voltage is not yet generated, the signal generator 33 generates at a determined switch-on timing a turn-on voltage signal by which the transistor 20 is turned on.

An example of the transistor 20 will now be described. For example, a GaN-HEMT is used as the transistor 20.

Figure 3:
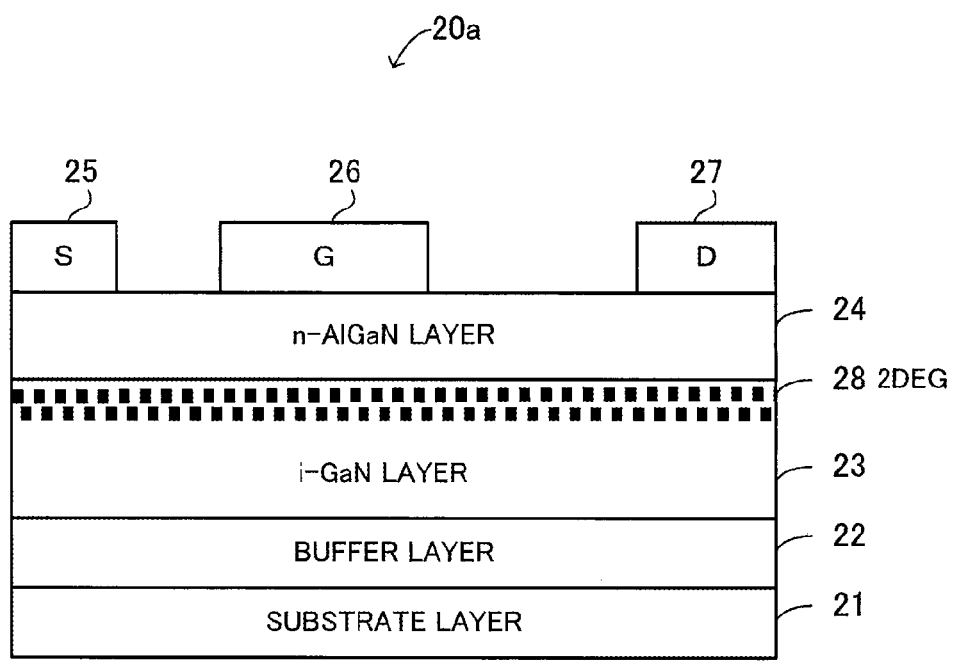
FIG. 3 illustrates an example of the structure of a GaN-HEMT.

FIG. 3 illustrates an example of the structure of a GaN-HEMT.

With a GaN-HEMT 20a, a buffer layer 22, an intentionally undoped gallium nitride (i-GaN) layer 23, and an n-type aluminum gallium nitride (n-AlGaN) layer 24 are formed over a substrate layer (conductive substrate) 21.

Furthermore, a gate electrode 26 is formed over the n-AlGaN layer 24 and a source electrode 25 and a drain electrode 27 are formed with the gate electrode 26 therebetween.

The n-AlGaN layer 24 is an electron supply layer and the i-GaN layer 23 is an electron transit layer. Furthermore, two-dimensional electron gas (2DEG) 28 is generated near an interface of the i-GaN layer 23 and the n-AlGaN layer 24. For example, a high-speed semiconductor device having low on-state resistance and high breakdown voltage is realized because of the characteristics, such as high carrier concentration and high electron saturation velocity, of the 2DEG 28.

A power factor correction (PFC) circuit to which the above power supply circuit 1a is applied will now be described.

Figure 4:
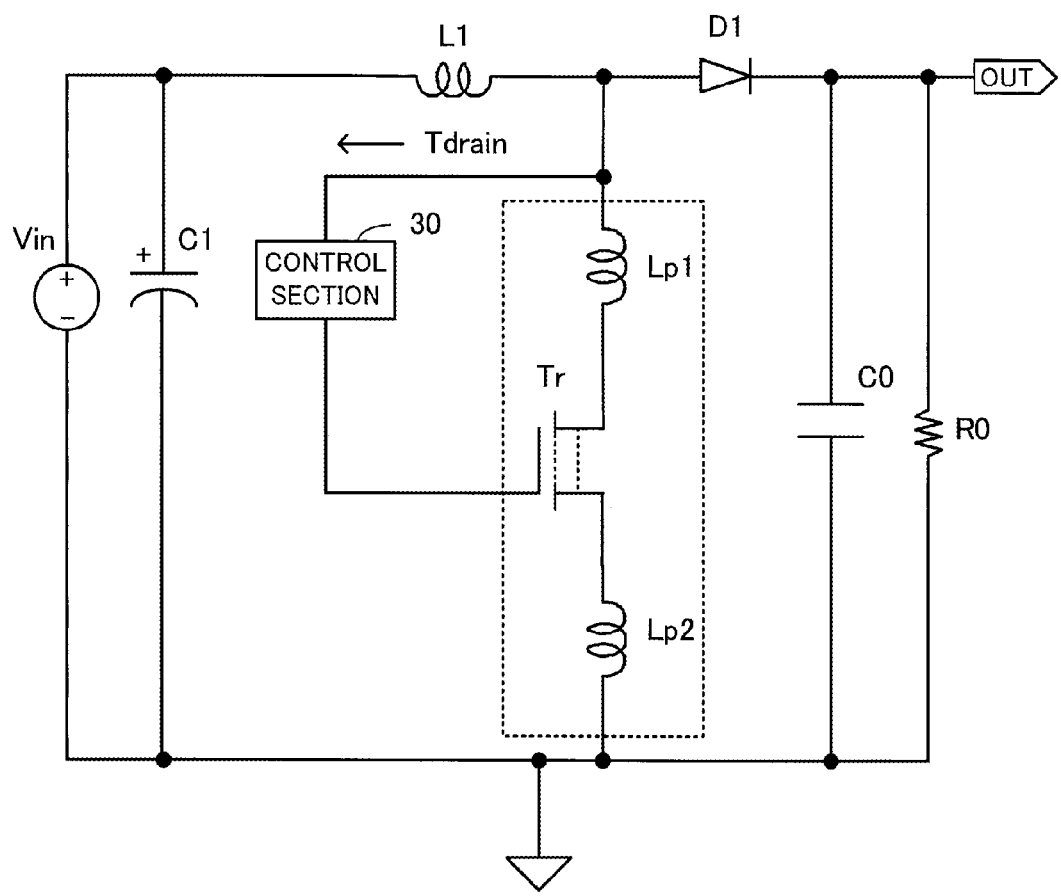
FIG. 4 illustrates an example of a power factor correction circuit.

FIG. 4 illustrates an example of a power factor correction circuit. A power factor correction circuit 4 generates a current waveform similar to input voltage (current which is in-phase with input voltage and whose waveform has the shape of a sine wave) to improve a power factor.

The power factor correction circuit 4 includes an input voltage section Vin, capacitors C0 and C1, a resistor R0, inductors L1, Lp1, and Lp2, a transistor Tr, and a diode D1. In the following description a normally-on GaN-HEMT is used as the transistor Tr. However, a junction FET (JFET) may be used as the transistor Tr.

Each element is connected in the following way. A positive terminal (+) of the input voltage section Vin is connected to a positive terminal (+) of the capacitor C1 and one end of the inductor L1. The other end of the inductor L1 is connected to an anode of the diode D1, one end of the inductor Lp1, and an input end of a control section 30.

The other end of the inductor Lp1 is connected to a drain of the transistor Tr. A gate of the transistor Tr is connected to an output end of the control section 30 and a source of the transistor Tr is connected to one end of the inductor Lp2.

A cathode of the diode D1 is connected to one end of the capacitor C0, one end of the resistor R0, and an output terminal OUT.

A negative terminal (−) of the input voltage section Vin is connected to a negative terminal (−) of the capacitor C1, the other end of the inductor Lp2, the other end of the capacitor C0, the other end of the resistor R0, and GND.

The input voltage section Vin generates input voltage. The capacitor C1 smooths the input voltage. The inductor L1 is a step-up inductor and raises the smoothed voltage to a determined value. In addition, a signal which flows through the inductor L1 flows to the diode D1 or the control section 30. The diode D1 rectifies the signal outputted from the inductor L1.

On the other hand, the transistor Tr is used as a switching element. The inductors Lp1 and Lp2 are parasitic inductors which appear as parasitic elements at the time of the transistor Tr being mounted over a board. The control section 30 controls switching of the transistor Tr (example of the internal structure of the control section 30 will be described later in FIG. 5).

When the transistor Tr is off, the signal outputted from the inductor L1 flows through the diode D1 and charges the capacitor C0 (smoothing capacitor). When the transistor Tr is on, the signal outputted from the inductor L1 flows through the control section 30. In addition, the control section 30 suppresses surge voltage generated by the parasitic inductors Lp1 and Lp2 around the transistor Tr.

It is assumed that the transistor Tr is a normally-on GaN-HEMT. In order to turn on the transistor Tr, the control section 30 applies 0 V as a turn-on voltage signal to the gate of the transistor Tr. Furthermore, in order to turn off the transistor Tr, the control section 30 applies a negative voltage as a turn-off voltage signal to the gate of the transistor Tr.

If the power factor correction circuit 4 is incorporated in a switching power supply apparatus as an example of the application of the power factor correction circuit 4, input voltage is full-wave-rectified by a diode bridge or the like and an output signal after the full-wave rectification is smoothed by the capacitor C1 included in the power factor correction circuit 4. Furthermore, a direct current (DC)-DC converter is located at the output stage of the power factor correction circuit 4 to convert a signal outputted from the output terminal OUT to determined DC voltage.

An example of a circuit of the control section 30 will now be described.

Figure 5:
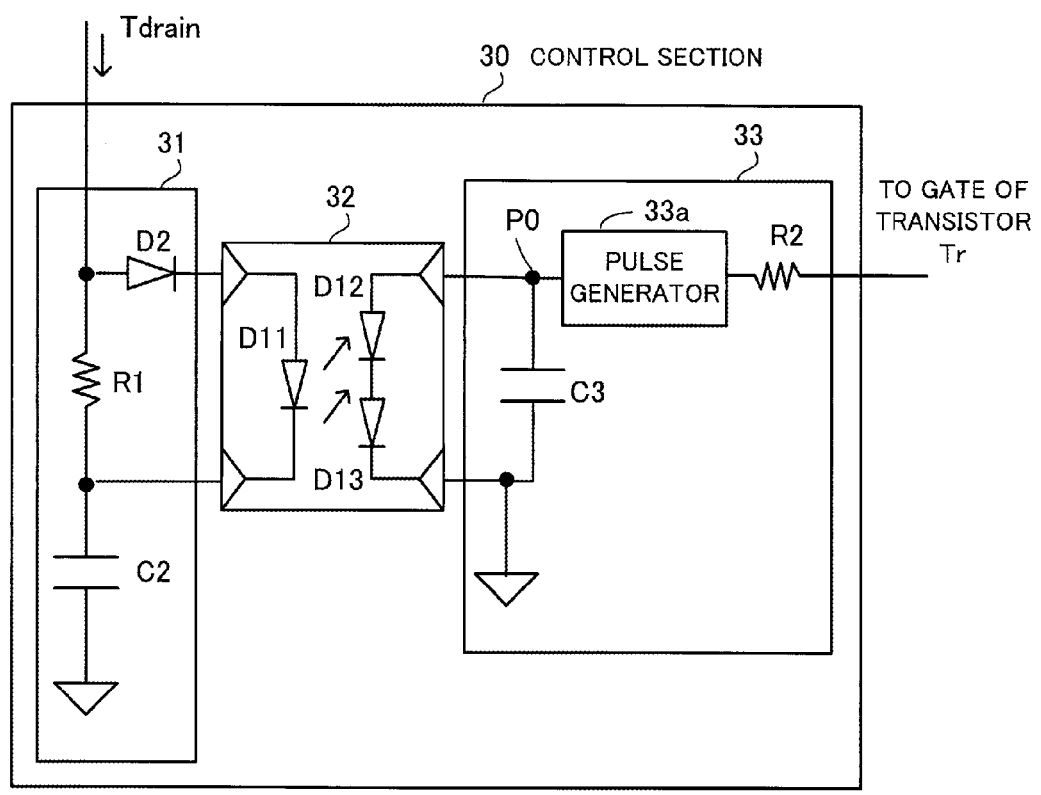
FIG. 5 illustrates an example of a control section.

FIG. 5 illustrates an example of the control section.

The control section 30 includes the transmitter 31, the photocoupler 32, and the signal generator 33.

The transmitter 31 includes a diode D2, a resistor R1, and a capacitor C2. The photocoupler 32 includes a light-emitting diode D11, which is a light-emitting element, and photodiodes D12 and D13, which are light receiving elements. The signal generator 33 includes a capacitor C3, a resistor R2, and a pulse generator 33a.

Each element is connected in the following way. An anode of the diode D2 is connected to one end of the resistor R1, the other end of the inductor L1 illustrated in FIG. 4, the one end of the inductor Lp1 illustrated in FIG. 4, and the anode of the diode D1 illustrated in FIG. 4.

A cathode of the diode D2 is connected to an anode of the diode D11 included in the photocoupler 32. The other end of the resistor R1 is connected to one end of the capacitor C2 and a cathode of the diode D11 included in the photocoupler 32. The other end of the capacitor C2 is connected to GND.

One end of the capacitor C3 is connected to an input end of the pulse generator 33a and an anode of the diode D12 included in the photocoupler 32. A cathode of the diode D12 is connected to an anode of the diode D13 included in the photocoupler 32.

The other end of the capacitor C3 is connected to a cathode of the diode D13 included in the photocoupler 32 and GND. An output end of the pulse generator 33a is connected to one end of the resistor R2. The other end of the resistor R2 is connected to the gate of the transistor Tr illustrated in FIG. 4.

The circuit of the control section 30 is an example. For example, the number of photodiodes is not limited to two.

If a high voltage based on a surge (hereinafter referred to as surge voltage) is generated at the time of driving the transistor Tr which is a normally-on GaN-HEMT, then the diode D2 is turned on by the surge voltage. As a result, current which flows due to the surge voltage (surge current) flows through the diode D2, flows through the light-emitting diode D11 included in the photocoupler 32 in the forward direction, and makes the light-emitting diode D11 emit light.

The photodiodes D12 and D13 included in the photocoupler 32 receive the light emitted by the light-emitting diode D11 and convert it to an electrical signal. That is to say, the photocoupler 32 converts the surge voltage to optical energy and converts the optical energy to electrical energy.

At this time light receiving current flows through the photodiodes D12 and D13. This light receiving current flows in the direction of from the cathodes to the anodes of the photodiodes D12 and D13. As a result, a negative voltage is generated at a node P0. The capacitor C3 stores a negative electric charge by the negative voltage corresponding to the surge voltage.

The pulse generator 33a generates a negative-voltage pulse signal on the basis of the applied negative voltage and applies it to the gate of the transistor Tr via the resistor R2 to turn off the transistor Tr.

A charge pump circuit may be used as a circuit which generates a negative voltage. In that case, however, a capacitor whose capacitance is large is used for obtaining stable output. On the other hand, if a negative voltage is generated by adopting the above circuit structure, there is no need to use a charge pump circuit. This reduces circuit area.

Figure 6:
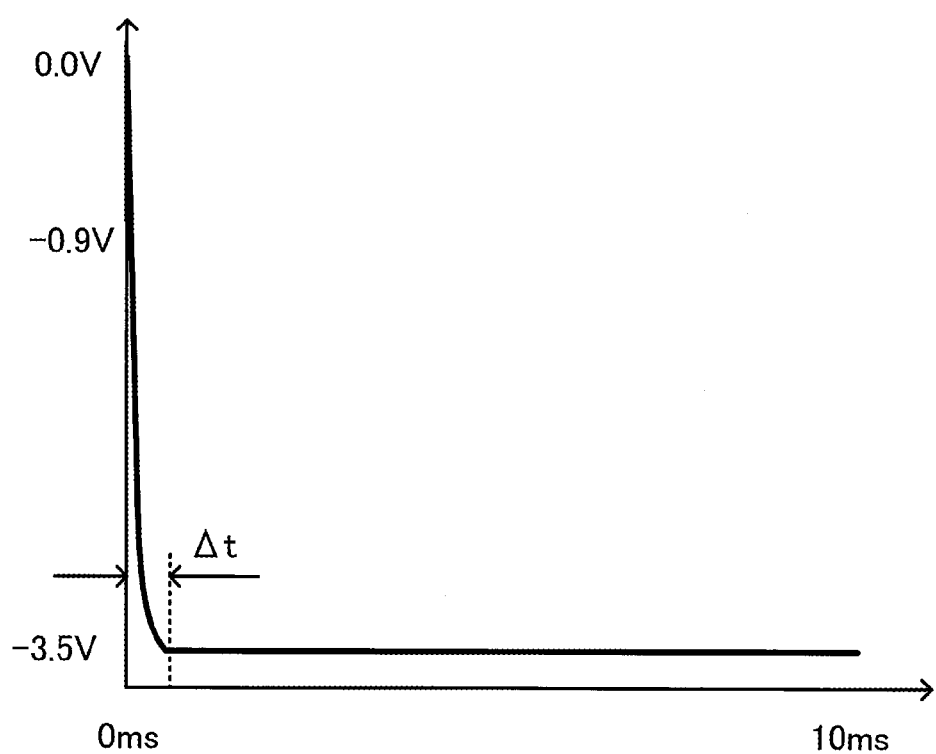
FIG. 6 illustrates an example of a state in which a negative voltage is generated.

FIG. 6 illustrates an example of a state in which a negative voltage is generated.

In FIG. 6, a vertical axis indicates voltage and a horizontal axis indicates time. FIG. 6 indicates the simulation results of a voltage fall level at the point P in the power factor correction circuit 4. A voltage level at the point P is 0 V at time 0 ms (at this time surge voltage is not yet generated).

When surge voltage is generated, a voltage level at the point P falls rapidly from 0 V to about −3.5 V for time Δt and then is kept at −3.5 V for a certain period of time. As can be seen from FIG. 6, a negative voltage is obtained for a certain period of time.

On the other hand, in a steady state in which surge voltage is not generated in the transistor Tr, the voltage amplitude value of a signal (drain signal Tdrain in FIG. 4) which flows into the control section 30 is smaller than a surge voltage value. In this case, the diode D2 is off, so current does not flow to the photocoupler 32. At this time a negative voltage is not generated at the node P0. If input is at such a level, then the pulse generator 33a transmits a switch-on signal and a switch-off signal to the gate of the transistor Tr in a determined cycle.

A modification of the control section 30 will now be described.

Figure 7:
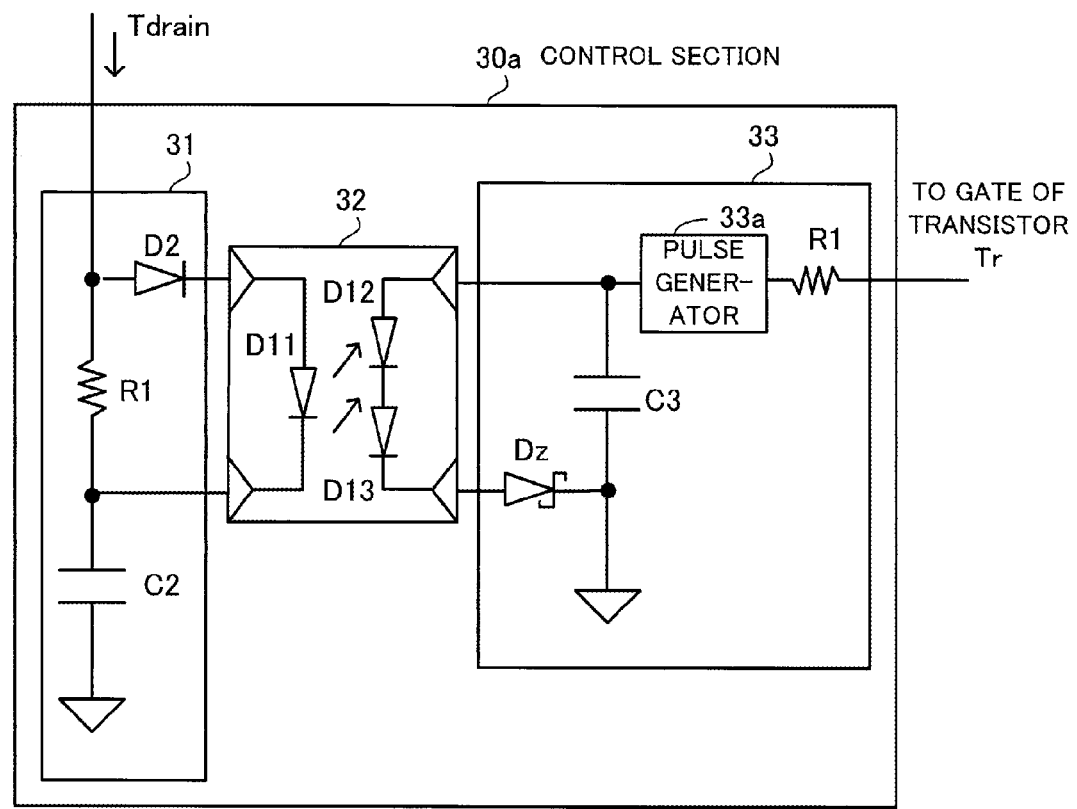
FIG. 7 illustrates a modification of the control section.

FIG. 7 illustrates a modification of the control section.

A control section 30a, which is a modification of the control section 30, is obtained by adding a Zener diode Dz as a new circuit element to the circuit illustrated in FIG. 5.

An anode of the Zener diode Dz is connected to a cathode of a photodiode D13 included in a photocoupler 32 and a cathode of the Zener diode Dz is connected to the other end of a capacitor C3 and GND. In the other respects the control section 30a is the same as the control section 30 illustrated in FIG. 5.

As illustrated in FIG. 7, the Zener diode Dz is located in order to protect the photocoupler 32 against reverse voltage applied to the cathode of the photodiode D13 included in the photocoupler 32. As a result, reverse voltage applied to the photocoupler 32 is kept at voltage which is lower than the breakdown voltage. This prevents a failure from occurring in the photocoupler 32.

Simulation results in which surge voltage is suppressed by adopting the present disclosure will now be described.

Figure 8:
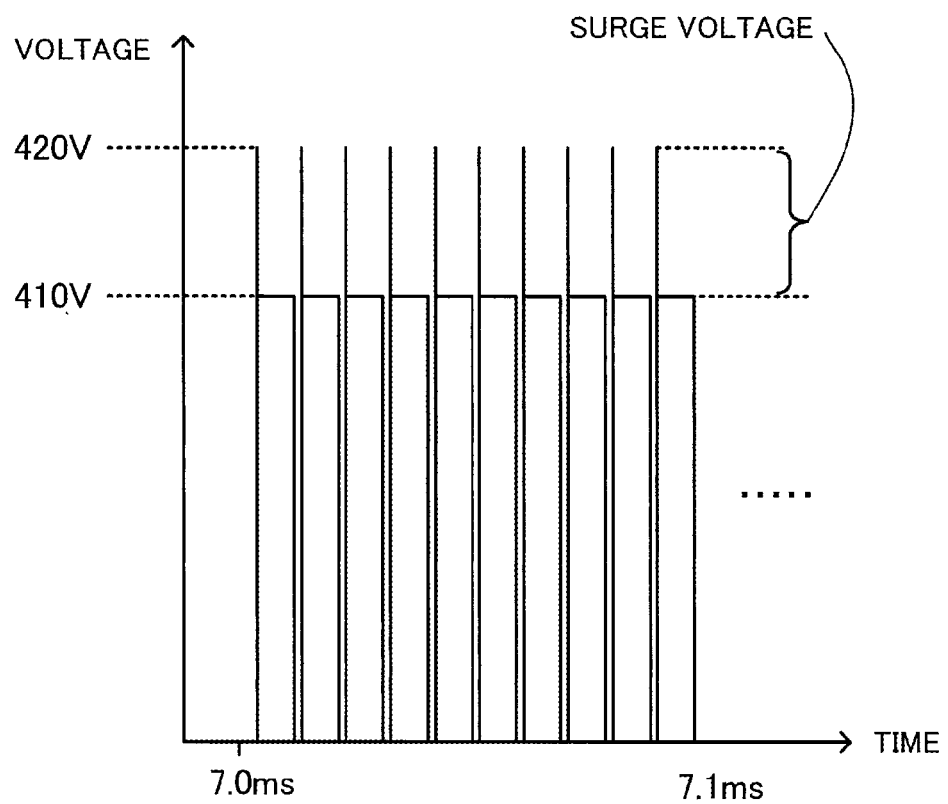
FIG. 8 illustrates an example of a state in which surge voltage is generated.

FIG. 8 illustrates an example of a state in which surge voltage is generated.

In FIG. 8, a vertical axis indicates voltage and a horizontal axis indicates time. FIG. 8 illustrates the state of the amplitude of a drain signal at switching time in a switching transistor of a power factor correction circuit to which the present disclosure is not applied.

The switching transistor repeatedly turns on and off cyclically, so a drain signal takes the form of a pulse. In the case of FIG. 8, usually a peak value of the amplitude of the drain signal is 410 V. In the ordinary power factor correction circuit, surge voltage is generated at the time of the switching operation of the switching transistor (for example, just after the switching transistor turns off) and its peak value rises to 420 V.

Figure 9:
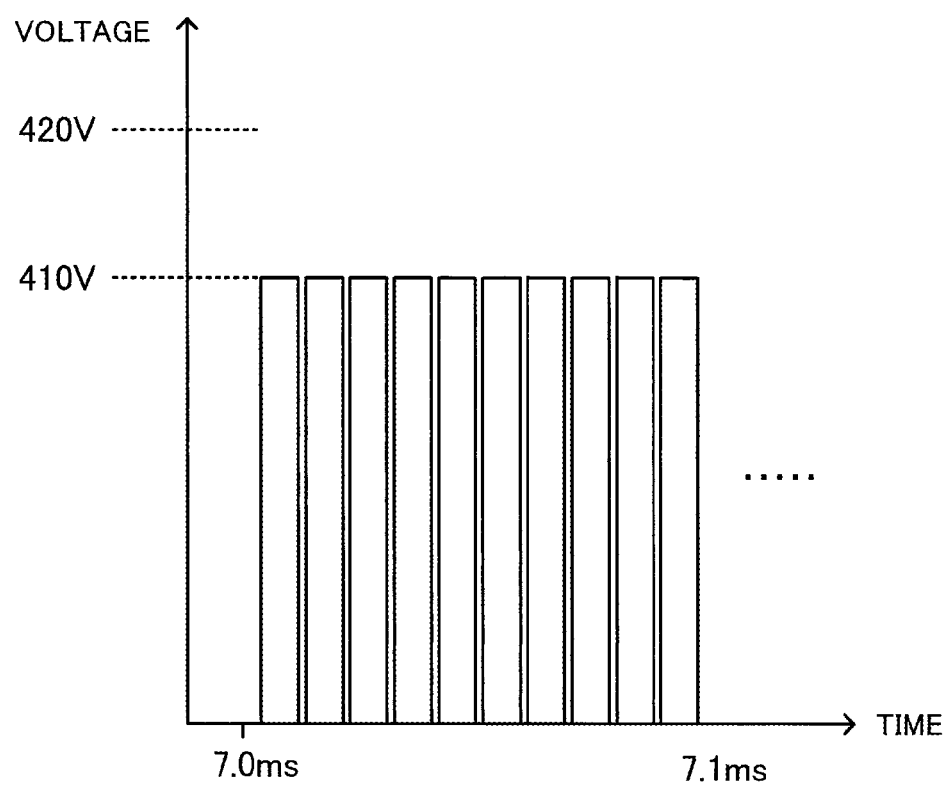
FIG. 9 illustrates an example of a state in which surge voltage is suppressed.

FIG. 9 illustrates an example of a state in which surge voltage is suppressed.

In FIG. 9, a vertical axis indicates voltage and a horizontal axis indicates time. FIG. 8 illustrates the state of the amplitude of a drain signal at switching time in the transistor Tr of the power factor correction circuit 4 to which the present disclosure is applied. As can be seen from FIG. 9, surge voltage is suppressed in the power factor correction circuit 4.

Figure 10:
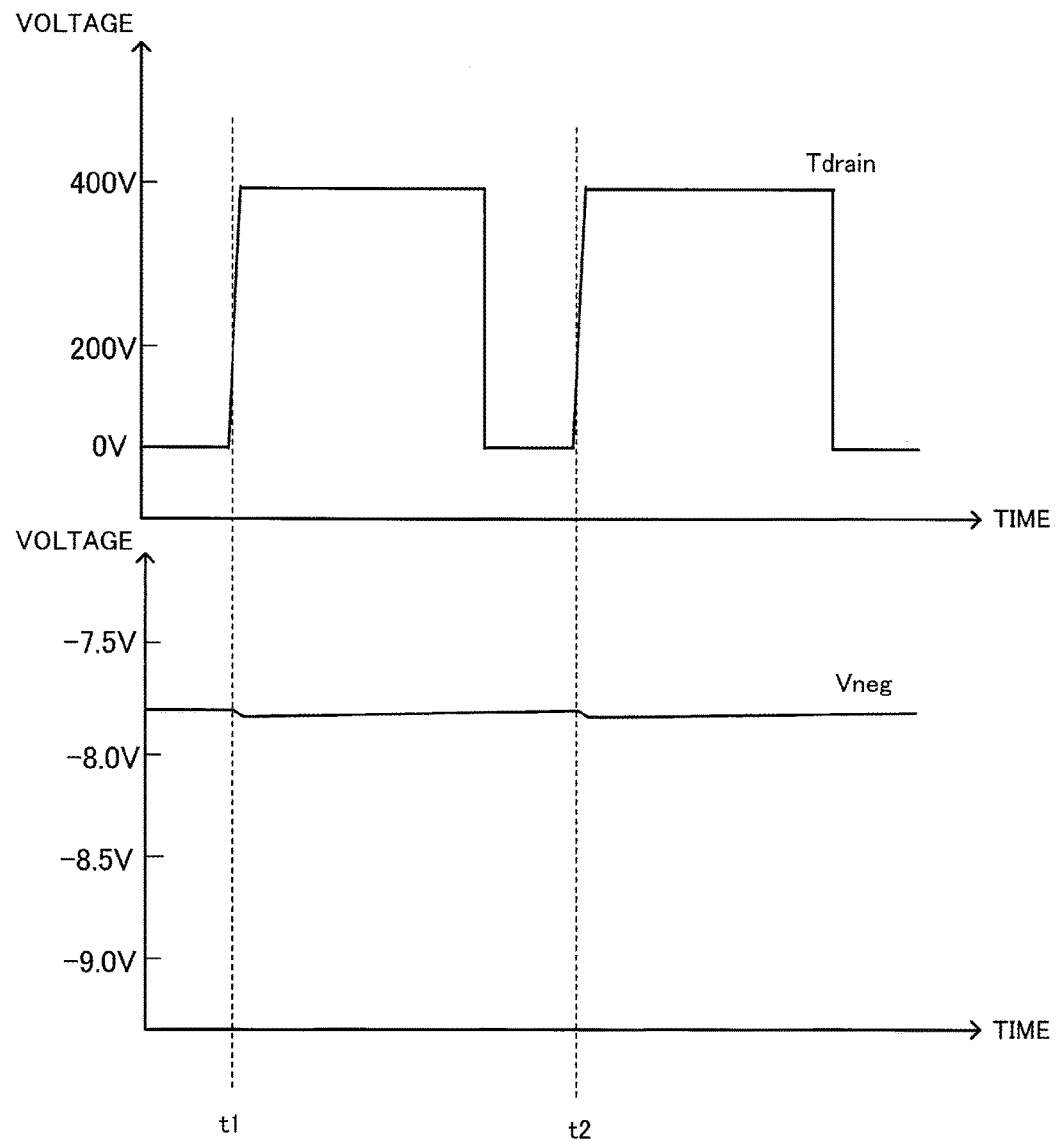
FIG. 10 illustrates an example of the generation of a negative voltage.

FIG. 10 illustrates an example of the generation of a negative voltage.

In FIG. 10, a vertical axis indicates voltage and a horizontal axis indicates time. FIG. 10 illustrates the states of the drain signal Tdrain and a generated negative voltage Vneg at switching time in the transistor Tr of the power factor correction circuit 4 to which the present disclosure is applied.

As can be seen from FIG. 10, the negative voltage Vneg falls, that is to say, a negative voltage is generated, when the drain signal Tdrain rises, for example, at timing t1 or t2. This negative voltage is used as turn-off voltage of the switching transistor.

As has been described in the foregoing, according to the present disclosure surge energy is converted to optical energy in order to take a measure against a surge which occurs at the time of driving a transistor. Furthermore, the optical energy is converted to electrical energy. Off voltage used for making switching of the transistor off is generated on the basis of the electrical energy and is supplied to the transistor.

Formerly an inductor and a capacitor were combined to suppress surge voltage. This increases circuit scale. With the present disclosure, on the other hand, there is no need to use a resonant element, such as an inductor, as an anti-surge measure. This checks an increase in circuit scale and suppresses a surge.

In addition, a switching element (transistor) corresponds to a surge occurrence portion. Formerly an increase in the number of switching elements led to an increase in the number of inductors. As a result, circuit scale increased significantly. With the present disclosure, on the other hand, there is no need to use an inductor. Accordingly, even if the number of switching elements increases, an increase in circuit scale is checked and surge voltage is suppressed with great accuracy.

On the other hand, a Si-based field effect transistor inevitably includes a body diode and this body diode is connected in inverse parallel to the transistor. Accordingly, even if a surge occurs, an avalanche breakdown occurs and therefore the transistor has surge resistance.

However, a GaN-HEMT does not inevitably include a body diode. As a result, if a surge occurs, a failure or the like tends to occur. Accordingly, a surge is effectively suppressed by applying an anti-surge measure according to the present disclosure especially to a circuit in which a GaN-HEMT is used as a switching element.

The embodiments have been described in the foregoing. However, each component indicated in the embodiments may be replaced with another unit having the same function. Furthermore, any other component or process may be added.

According to the disclosed power supply circuit or power factor correction circuit, circuit scale is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power supply circuit comprising:
a switching element; and
a control section which converts surge voltage generated at the time of operation of the switching element to optical energy and which turns off the switching element on the basis of an electrical signal obtained by converting the optical energy.

2. The power supply circuit according to claim 1, wherein:
the switching element is a field effect transistor; and
the control section includes:
a converter including a light-emitting element which converts the surge voltage to the optical energy and a light receiving element which converts the optical energy to the electrical signal;
a transmitter which transmits the surge voltage to the converter; and
a signal generator which generates from the electrical signal a gate signal to be supplied to a gate of the field effect transistor at the time of the surge voltage being generated.

3. The power supply circuit according to claim 2, wherein:
the transmitter includes a diode, a resistor, and a capacitor; and
an anode of the diode is connected to one end of the resistor, a cathode of the diode is connected to one end of the light-emitting element, and another end of the resistor is connected to another end of the light-emitting element and one end of the capacitor.

4. The power supply circuit according to claim 2, wherein the signal generator:
includes a capacitor connected to the light receiving element; and
generates a negative voltage at a node between the light receiving element and the capacitor by the electrical signal which the converter obtains by converting the optical energy, and generates the gate signal based on the negative voltage.

5. A power factor correction circuit which generates a current waveform similar to input voltage to improve a power factor, the circuit comprising:
an inductor which raises the input voltage;
a diode which rectifies an output signal from the inductor;
a switching element which performs switching of the output signal inputted to the diode;
a capacitor which smooths output voltage from the diode; and
a control section which converts surge voltage generated at the time of operation of the switching element to optical energy and which turns off the switching element on the basis of an electrical signal obtained by converting the optical energy.

* * * * *